US006939455B1

(12) United States Patent  
Hubel

(10) Patent No.: US 6,939,455 B1  
(45) Date of Patent: *Sep. 6, 2005

(54) METHOD AND DEVICE FOR THE ELECTROLYTIC TREATMENT OF ELECTRICALLY CONDUCTING SURFACES SEPARATED PLATES AND FILM MATERIAL PIECES IN ADDITION TO USES OF SAID METHOD

(75) Inventor: Egon Hubel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 290 days.

This patent is subject to a terminal disclaimer.

(21) Appl. No.: 10/110,570

(22) PCT Filed: Oct. 5, 2000

(86) PCT No.: PCT/DE00/03569

§ 371 (c)(1),  
(2), (4) Date: Apr. 12, 2002

(87) PCT Pub. No.: WO01/29290

PCT Pub. Date: Apr. 26, 2001

(30) Foreign Application Priority Data

Oct. 20, 1999 (DE) .............................. 199 51 324

(51) Int. Cl.⁷ ........................... C25D 5/00; C25D 7/06; C25D 17/28
(52) U.S. Cl. ..................... 205/137; 205/138; 205/145
(58) Field of Search ................... 205/118, 125, 129, 205/138, 145, 147, 300, 640, 604, 137; 204/198, 204/252

(56) References Cited

U.S. PATENT DOCUMENTS

| 3,755,116 A | * | 8/1973 | Terai et al. .................. 205/139 |
| 4,169,770 A | | 10/1979 | Cooke et al. .................. 204/28 |
| 4,534,832 A | | 8/1985 | Doiron et al. ................. 204/15 |
| 5,401,370 A | | 3/1995 | Kauper et al. ............... 204/228 |
| 5,788,824 A | | 8/1998 | Catonne et al. ............. 205/210 |
| 6,071,400 A | * | 6/2000 | Schroder et al. ............ 205/686 |

FOREIGN PATENT DOCUMENTS

| DE | 32 36 545 C3 | 10/1982 | |
| DE | 36 24 481 A1 | 7/1986 | |
| EP | 0 083 681 B1 | 11/1985 | |
| EP | 0 395 542 A1 | 10/1990 | |
| EP | 0 838 542 A1 | 10/1997 | |
| JP | 10259500 A | * 9/1998 | ............. C25F 7/00 |
| WO | WO 9737062 A1 | * 10/1997 | ............. C25D 5/02 |
| WO | WO 9965071 A1 | * 12/1999 | ......... H01L 21/288 |

OTHER PUBLICATIONS

PCT Publication WO 99/65071, Dec. 16, 1999.  
PCT Publication WO 97/37062, Oct. 9, 1997.  
Patents Abstracts of Japan C-315 11-20, 1985, no month.

* cited by examiner

Primary Examiner—Edna Wong  
(74) Attorney, Agent, or Firm—Paul & Paul

(57) ABSTRACT

For electrolytic treatment of circuit boards and foils LP, a method and a device are used in which the sheets and foils are transported through a treatment unit and brought thereby in contact with treatment fluid 3. The sheets and foils are guided during transportation past at least one electrode arrangement, which comprises respectively cathodically polarized electrodes 6 and anodically polarized electrodes 7, the cathodically and anodically polarized electrodes also being brought in contact with the treatment fluid. The cathodically polarized electrodes and the anodically polarized electrodes are connected to a current/voltage source 8, so that a current flows through the electrodes 6, 7 and the electrically conductive surfaces 4.

28 Claims, 7 Drawing Sheets

Figure 3:
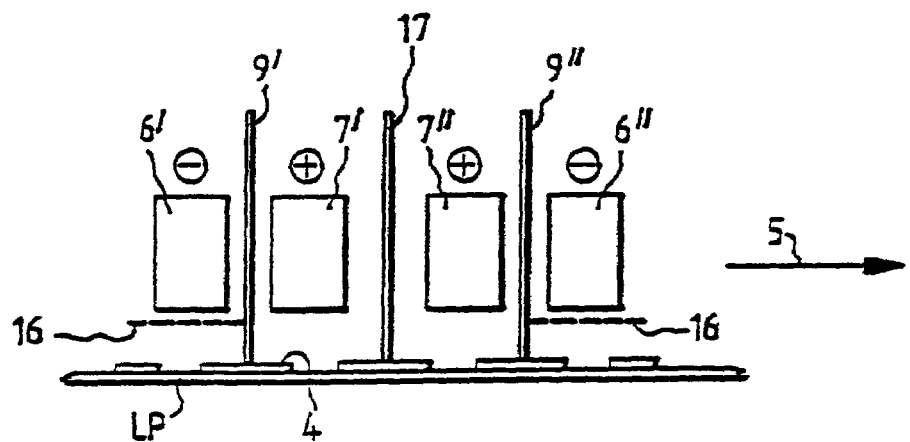

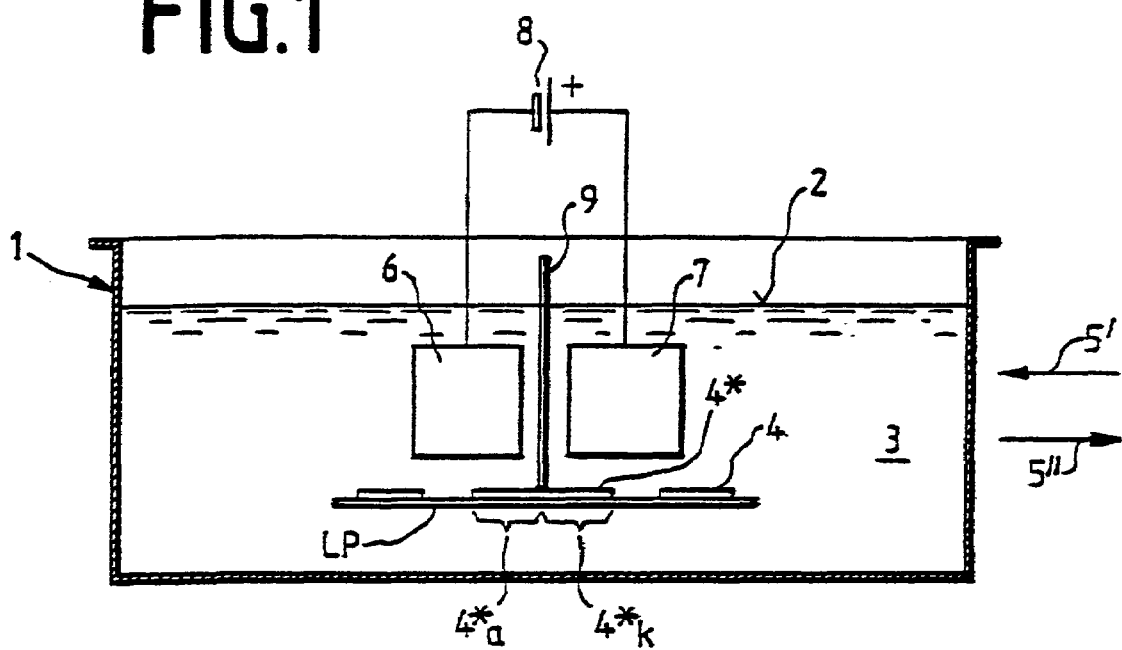
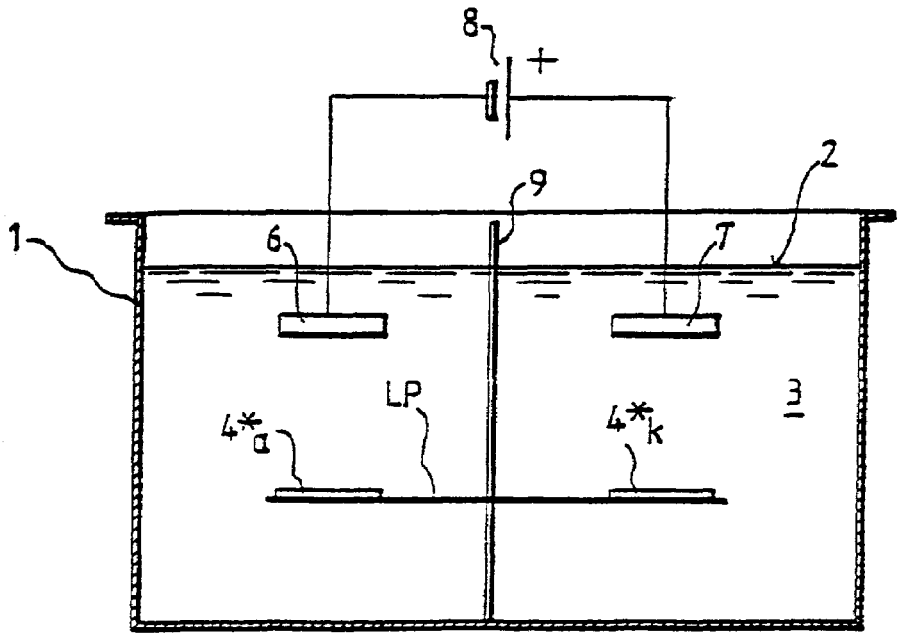

METHOD AND DEVICE FOR THE ELECTROLYTIC TREATMENT OF ELECTRICALLY CONDUCTING SURFACES SEPARATED PLATES AND FILM MATERIAL PIECES IN ADDITION TO USES OF SAID METHOD

BACKGROUND OF THE INVENTION (1) Field of the Invention

The invention relates to a method and device for electrolytic treatment of electrically conductive surfaces of mutually isolated sheet and foil material pieces and applications of the method, especially for producing circuit boards and conductive foils.

(2) Description of the Related Art

Electroplating processes are used to produce circuit boards and conductive foils in order either to deposit metal or to implement other electrolytic treatments, for example metal etching methods. For quite a number of years, so-called continnous system have been used for this purpose, the material being transported through said systems in a horizontal direction and, during transportation, being brought in contact with treatment fluid.

Such a continnous system is described for example in DE 36 234 481 A1. This unit has anodes, current supplies to the circuit boards to be coated and conveying means. The conveying means are configured as a continuous, revolving actuated row of individual clamps which hold the lateral edges of the circuit boards securely and move in the conveying direction. Current is supplied to the circuit boards via these clamps. For this purpose, the clamps are provided with current via brush arrangements.

Another type of electric contact and way of conveying circuit boards in a continnous system is described in DE 32 36 545 C3. In this case, contact wheels are used instead of clamps, said wheels rolling on the moved circuit boards and providing electrical contact with the circuit boards in this way.

Both systems must be elaborately constructed in order to be able to transfer the at times large metallising currents to the circuit boards. In the case of very high metallising currents, there are still no satisfactory solutions since fundamentally contact resistances occur at the contacts (clamps, contact wheels) so that the contact points can be heated to a very high degree from time to time by the current flow and the contacted metal surface can be damaged. This disadvantage is revealed in particular in those materials to be treated, which have, as in the case of circuit boards and conductive foils, a very thin conductive layer, usually of copper, on an insulating core layer. This thin layer can easily "burn through" when sufficiently large currents are used. The device of DE 36 32 545 C3 has the further disadvantage that metal is also deposited on the contact wheels, and the metal layer, especially on the bearing surfaces, can present problems. Only by dismantling the wheels and subsequently removing the deposited metal layer can this problem be resolved.

A fundamental disadvantage of this device resides in the fact that only whole-surface conductive surfaces can be electrolytically treated but not electrically mutually insulated structures.

As a solution to the latter problem, a method has been proposed in WO 97/37062 A1 for electrochemical treatment of electrically mutually insulated regions on circuit boards. Accordingly, the circuit boards, which are brought in contact with the treatment solution, are brought in contact successively with stationary brush electrodes, which are supplied from a current source, so that an electrical potential can be applied to the individual electrically conductive structures. An electrical potential is applied between the brushes, which are preferably formed of metal wires, and the anodes, which are disposed between the brushes.

This device has the disadvantage that the brushes are completely covered with metal within a very short time since approximately 90% of the metal is deposited on the brushes and only 10% on the regions to be metallised.

Therefore, the brushes must be freed again of metal after just a short operational time. For this purpose, the brushes must be dismantled again from the device and be freed of metal or else elaborately constructed devices need to be provided which help to remove again the metal on the brushes by means of electrochemical polarity reversal of the brushes to be regenerated. In addition, the brush ends can easily damage fine structures on the circuit boards. Likewise, the brush material thereby wears quickly, the finest particles being rubbed off and getting into the bath where they lead to damage during metallisation. Especially for metallising very small structures, for example those with a width or length of 0.1 mm, there must be used brushes with very thin wires. These wear especially quickly. Particles which come from the worn brushes then proceed into the bath and into the holes of the circuit boards and produce significant defects.

In other known methods for metallising electrically insulated structures on circuit board material, currentless metallising processes are used. However, these methods are slow, difficult to implement and expensive since fairly large quantities of chemical substances are used. The used substances are frequently environmentally damaging. They therefore incur further significant costs in disposing thereof. In addition, it is not ensured that only the electrically conductive structures are metallised. It is often observed that, in this case, the metal is also deposited on the electrically insulating surface regions which lie between, resulting in rejection.

Methods are known for electrolytic etching, pickling and metallising of metal strips and metal wires which methods are effected without electrical contact of the strips and wires:

A method is described in EP 0 093 681 B1 for continuous coating of wires, tubes and other semi-finished products made of aluminium with nickel. In this method, the semi-finished product is firstly conveyed into a first bath container and then into a second bath container. In the first bath container, the semi-finished product is guided past a negatively polarised electrode and, in the second bath container, guided past a positively polarised electrode. A metallising bath is situated in the bath containers. As a consequence of the fact that the semi-finished product is electrically conductive and, at the same time, is in contact with both metallising baths, the circuit between the electrodes, which are connected by a current source, is completed. In contrast to the negatively polarised electrode in the first bath container, the semi-finished product is anodically polarised. In contrast to the positively polarised electrode in the second bath container, the semi-finished product is on the other hand cathodically polarised so that metal can be deposited there.

A method is described in EP 0 838 542 A1 for electrolytic pickling of metallic strips, especially special steel strips, strips made of titanium, aluminium or nickel, the electrical current being directed through the bath without electrically conducting contact between the strip and the electrodes. The electrodes are disposed opposite the strip and polarised cathodically or anodically.

A method is known from EP 0 395 542 A1 for continuous coating of a substrate, which is made of graphite, aluminium or its alloys, with a metal, the substrate being guided successively through two containers, which are connected to each other and contain an activation bath or a metallising bath, a cathode being disposed in the first container and an anode in the second container. Using this method, rods, tubes, wires, strips and other semi-finished products can be coated as substrates.

Finally, a device is disclosed in Patent Abstracts of Japan C-315, Nov. 20, 1985, Vol. 9, No. 293, JP 60-135600 A for electrolytic treatment of a steel strip. The strip is guided through an electrolytic bath for this purpose between oppositely polarised electrodes. In order to prevent an electrical current flow between the oppositely situated and oppositely polarised electrodes, shielding plates are provided between the electrodes in the plane in which the bath is guided.

The problem underlying the present invention is therefore to avoid the disadvantages of the known electrolytic treatment methods and in particular to find a device and method with which a continuous electrolytic treatment of electrically conductive surfaces of mutually isolated sheet and foil material pieces is possible at low cost, especially for producing circuit boards and conductive foils, it also requiring to be ensured that the equipment costs are low and that the method can be implemented with adequate efficiency. In particular, the method and the device should be suitable for treating electrolytically electrically insulated metallic structures.

BRIEF SUMMARY OF THE INVENTION

The method and the device according to the invention serve for electrolytic treatment of electrically conductive surfaces of mutually isolated sheet and foil material pieces, especially for producing circuit boards and conductive foils, the electrically conducting surfaces not being directly in electrical contact. It is possible as a result to treat both whole-surface regions on the material pieces and structured regions which are electrically mutually insulated. Both externally situated regions and borehole walls in the circuit boards can be treated.

DETAILED DESCRIPTION OF THE INVENTION

In order to implement the method according to the invention, the material pieces are transported through a treatment unit and brought thereby in contact with treatment fluid. One possibility consists in transporting the material pieces in a horizontal conveying direction. The conveying plane in this case can stand both vertically and be orientated horizontally. Such an arrangement is implemented in so-called continnous system which are commonly used for example for producing circuit boards and conductive foils. For this purpose, the material pieces are transported by known means of circuit board technology, for example by rollers or cylinders.

The device according to the invention has the following features:

a) at least one device for bringing the material pieces in contact with a treatment fluid, for example a treatment container into which the material pieces can be introduced, or suitable nozzles, with which the liquid can be supplied to the material surface;

b) suitable transport devices for transporting the isolated material pieces through a treatment unit, preferably in a horizontal conveying direction in a conveying plane, for example rollers, cylinders or other retaining elements such as clamps;

c) at least one electrode arrangement, comprising respectively at least one cathodically polarised electrode and at least one anodically polarised electrode, at least the one cathodically polarised electrode and at least the one anodically polarised electrode being able to be brought in contact with the treatment fluid; the electrodes can be either disposed for one-sided treatment of the material pieces on only one side of the conveying line or, for two-sided treatment, also on both sides; the electrodes of an electrode arrangement are orientated on one side of the conveying line;

d) at least one insulation wall between the oppositely polarised electrodes in the electrode arrangements; and e) at least one current/voltage source which is electrically connected to the electrode arrangements in order to produce a current flow through the electrodes of the electrode arrangements, a galvano-rectifier or a comparable current/voltage source or a current/voltage source for producing unipolar or bipolar current pulses being able to be used as the current/voltage source.

In order to implement the method according to the invention, the material pieces are brought in contact with the treatment fluid while being transported through the treatment unit and guided past at least one electrode arrangement, which comprises respectively at least one cathodically polarised electrode and at least one anodically polarised electrode. The cathodically and anodically polarised electrodes are also brought in contact with the treatment fluid and connected to a current/voltage source so that, on the one hand, a current flows between the cathodically polarised electrode and an electrically conductive region on the material pieces and, on the other hand, a current flows between the anodically polarised electrode and the same electrically conductive region on the material pieces if this region is situated opposite both electrodes at the same time. The electrodes of an electrode arrangement are disposed in such a way that they are orientated on one side of the material pieces. At least one insulation wall is disposed between the electrodes.

If a two-sided treatment of the material pieces is desired, electrodes must be disposed on both sides of the material. In the case of one-sided treatment, it is adequate to have electrodes on one side of the material.

The electrodes are electrically connected by for example a galvano-rectifier. If a plurality of electrode arrangements is used then all of the electrode arrangements can be connected to the same galvano-rectifier. In certain conditions, it can also be advantageous however to connect the individual electrode arrangements respectively to one galvano-rectifier. The galvano-rectifiers can be operated as current source or as voltage source. When treating electrically mutually insulated structures, the galvano-rectifier is preferably voltage-controlled and, when treating whole-surface layers, preferably current-controlled.

As a consequence of the fact that an electrically conductive connection exists by means of a conductive layer to be processed on the surface regions of the material pieces, which are situated opposite the cathodically polarised electrode or the anodically polarised electrode at the same time, these surface regions are polarised respectively anodically or cathodically relative to the electrodes. As a result, electrochemical processes are set in motion at these places. An electrical contact of the material pieces is not required to produce a current flow in the material pieces. The material pieces operate as intermediate conductors. An electrode and the surface region situated opposite this electrode on the material piece can be regarded as an electrolytic partial cell. One of the two electrodes of this partial cell is formed by the material piece itself and the other by the electrode of the electrode arrangement. As a result of the fact that the material piece is disposed opposite a cathodically and an anodically polarised electrode, a serial connection of two electrolytic partial cells of this type is effected, said partial cells being supplied from a current/voltage source, for example from a galvano-rectifier.

The advantage of the method and the device according to the invention compared to known methods and devices used in circuit board technology resides in the fact that the equipment costs for producing a current flow in the material pieces to be treated is a great deal less than in the known methods and devices. In the present case, no contacting elements need to be provided. The material pieces are polarised without contact. As a result, the deposition of metal, especially with a small layer thickness, can be implemented very economically. Furthermore, the arrangement can be configured very simply.

The method and the device according to the invention therefore make possible the electrolytic treatment of electrically mutually insulated, metal islands (structures) at low cost.

Relative to the methods proposed for circuit board technology for metallising mutually insulated metal islands with brush arrangements, the method and device according to the invention have the advantage that only small quantities of metal are deposited needlessly on the cathodically polarised electrode. The frequency with which the metal must be removed from the cathodically polarised electrodes again, is in the region of a few days to a few weeks. In addition, there is no problem of the brush electrodes becoming worn during contact with the surfaces to be metallised and hence of abraded particles contaminating the treatment bath.

Since the electrodes of an electrode arrangement, which are polarised oppositely to each other, are mutually screened in such a manner that substantially no electrical current can flow directly between these electrodes, the efficiency of the method relative to known methods and devices is increased by a multiple since the current yield is very much greater. Only when, according to the invention, an insulation wall is provided between the oppositely polarised electrodes in the electrode arrangements, can the net effect be achieved also on the electrically insulated structures in that the spacing between the electrodes is adjusted according to the size of the structures to be treated, while an adequate effect level of the method is maintained. In the case of small structures, a small spacing is required; in the case of larger structures, the spacing can also be larger. By means of the insulation wall, a direct current flow is prevented thereby between the oppositely polarised electrodes (short-circuit current) and likewise a direct current flow from the one electrode to the region on the substrate to be treated which is situated opposite the other electrode and vice versa.

The option is also advantageous that very high currents can be transferred without difficulty to the material pieces to be treated without the electrically conductive surface layers of the material pieces being heated and damaged or even destroyed since no contact means are required. Circuit board and conductive foil material usually has external metal laminations which have a thickness of for example approximately 18 $\mu$m. Recently, materials have also been used for producing very complex electrical circuits which have very much thinner outer layers made of metal, for example layers with a thickness of approximately 0.5 $\mu$m. While these layers are easily "burnt through" with conventional contact technology, this danger is not presented by the method according to the invention as a uniform current distribution can be set up within the layer. Because of the effective cooling of the material pieces to be coated by the surrounding treatment fluid, the specific current loading in the metal layer to be treated can be set very high, for example up to 100 A/mm$^2$.

The method and the device can be used for implementing any electrolytic processes: electroplating, etching, oxidising, reduction, cleaning, electrolytic assistance in non-electrolytic per se processes, for example for starting a currentless metallising process. For example, gases can also be produced on the surfaces of the material pieces, namely hydrogen in a cathodic reaction and/or oxygen in an anodic reaction. It is also possible for these individual processes to take place at the same time, together with other methods, for example metallising processes or other electrochemical processes.

Areas of application of the method or the device according to the invention are among others:
  deposition of thin metal layers;
  selective electroplating of structures (island electroplating);
  transference of surface layers made of metal within a sheet or foil from one sacrificial region to another region, for example in order to reinforce surface layers with the metal which is obtained from the sacrificial region;
  thinning of structures by etching;
  removal and thinning of whole-surface layers by etching, for example the removal of a layer of several $\mu$m from the surfaces of circuit board material before implementing through hole plating (simultaneous electrolytic deburring of the borings);
  selective etching of structures (island etching);
  whole-surface or selective pulse etching;
  deposition of metal with pulse current on large surfaces or on small structures;
  electrolytic oxidation and reduction of metallic surfaces;
  electrolytic cleaning by anodic or cathodic reaction (for example, by electrolytic formation of hydrogen or oxygen);
  etch-cleaning with electrolytic assistance; and further processes in which electrolytic assistance is advantageous.

The method and the device can be used particularly well for depositing thin metal layers, for example layers up to a thickness of 5 $\mu$m. The deposition of layers of this type is too expensive when using conventional continuous system since these systems are very elaborate because of the required contacting.

The following conditions among others can be set for implementing the method according to the invention:
  the type of material from which the basic conductive layer of the material pieces to be treated is formed;
  the type of coating metal;
  the type and the parameters of the electrolytic process, for example the current density;
  the composition of the treatment fluid;
  the geometry of the treatment device, for example the width of the electrode spaces in the conveying direction.

By optimal selection of combinations of the above-mentioned parameters, the electrolytic treatment can be controlled. For example, by choosing a specific metal depositing bath it can be effected that the already deposited metal is not etched off again since the metal dissolution process is restricted in this case. At the same time, it can be achieved by appropriate choice of an etching bath that the metal deposition in this bath is restricted.

In order to implement the method for etching metal surfaces on the material pieces, the material pieces are guided firstly past at least one anodically polarised and then at least one cathodically polarised electrode.

The method and the device can be used for metallising whole-surface metal layers, the material pieces being guided firstly past at least one cathodically polarised and then at least one anodically polarised electrode. In contrast to many known methods and devices, it is also possible to deposit metal on material pieces provided with electrically mutually insulated metal islands without difficulty. Preferably, material pieces are used for electrolytic metallising, which pieces are provided with a surface which is insoluble during electrolytic metallising. For example, final layers made of metal can be formed on circuit boards and conductive foils, for example a tin coating on copper, with the method and the device according to the invention.

A further advantageous application of the method and of the device consists in the fact that the outer copper layer on circuit board material, which layer normally has a thickness of approximately 18 μm, is thinned before further processing. A circuit board material which is covered for example with a copper layer of only 3 to 5 μm thickness is eminently suitable for producing the finest conductive circuits. As a result, the cost of laser boring and etching in the circuit board production process is much reduced. The formation of such a thin copper layer with the method and the device according to the invention by means of metallisation is possible without difficulty. A removal by etching of copper from a copper layer, which has a fairly large layer thickness, can also be qualitatively and economically meaningful. By forming the fairly thin copper layers, the copper structures are prevented from being under-etched during the subsequent etching process. This method and the device offer significant advantages relative to conventional technology, since materials of this type are difficult to produce with conventional methods and devices. In this case, correspondingly thin and very expensive copper foils must of course be implemented.

A further application of the method and the device consists in deburring the circuit boards and conductive foil material after boring by means of electrolytic etching. To date, devices have been used which are based on mechanical methods, for example, rotary brushes with which the burr is removed. Mechanical methods of this type are however entirely unusable for foil materials since the foil materials would be destroyed by mechanical treatment.

The principle of the method and device according to the invention is explained subsequently with reference to

BRIEF DESCRIPTIONS OF DRAWING FIGS. 1 AND 2

FIG. 1 schematic illustration of the device according to the invention; and

FIG. 2 schematic illustration of the principle of the method according to the invention.

FURTHER DETAILED DESCRIPTION OF THE INVENTION

A bath container 1 is illustrated in FIG. 1 and is filled up to the level 2 with a suitable treatment fluid 3. A circuit board- or conductive foil material piece LP, for example a multi-layer laminate (multilayer) which is already metallised and provided with conductive track structures 4 and with boring, is guided through the treatment fluid 3 in a horizontal direction 5' or 5" by means of suitable conveying means 3, such as for example rollers or cylinders (not shown). In addition, there are two electrodes 6 and 7 in the bath container which are connected to a current/voltage source 8. The electrode 6 is cathodically polarised, the electrode 7 anodically polarised. An insulation wall 9 (for example of plastic material) is disposed between the two electrodes 6, 7 and screens the two electrodes from each other electrically, transversely relative to the conveying direction. This wall 9 is preferably introduced so tightly against the material piece LP that said wall contacts or at least reaches up to said material piece LP when passing by.

While the material piece LP is being moved past the electrodes 6, 7, it is polarised, and indeed anodically in the regions $4^*_a$, which are situated opposite the cathodically polarised electrode 6, and cathodically in the regions $4^*_k$, which are situated opposite the anodic electrode 7.

If the material piece LP is guided past the electrodes 6, 7 for example in the direction 5', then the structures 4 are etched. In this case, the left region $4^*_a$ of the structure $4^*$ is anodically polarised in the position shown in FIG. 1 so that metal is etched away from the conductive track structure. The right region $4^*_k$ of this structure $4^*$ is, on the other hand, orientated towards the anodically polarised electrode 7 and hence is negatively polarised. If the treatment fluid 3 contains no further electrochemically active redox pairs, hydrogen is generated in this region $4^*_k$. In summary, metal is therefore removed from the structures 4. This procedure continues in the case of a single structure 4 for as long as this structure is situated simultaneously in the effective regions of both oppositely polarised electrodes 6 and 7.

If the material piece LP is to be metallised, it must be transported in the the direction 5". In this case, a metallising bath is used as treatment fluid 3. Firstly, the right edge of the material piece LP enters into the region of the cathodically polarised electrode 6 and then into the region of the anodically polarised electrode 7. The right part $4^*_k$ of the structure $4^*$ is situated opposite the anodically polarised electrode 7 in the position shown in FIG. 1 and thus is polarised cathodically. On the other hand, the left part $4^*_a$ of the structure $4^*$ is situated opposite the cathodically polarised electrode 6 so that this part is polarised anodically. If for example a conductive track structure, which is made of copper as the basic conductive layer, is to be treated with tin from an aqueous tinning bath 3 which contains tin ions, then only oxygen is generated on the left part $4^*_a$ of the structure $4^*$. On the other hand, tin is deposited on the right part $4^*_k$. To sum up, tin is thus deposited on the copper structures.

The same arrangement as described in FIG. 1 is shown in FIG. 2, provided with a bath container 1 with electrolytic fluid 3. The level of fluid 3 is designated by 2. In addition to FIG. 1, the effect of the electrical field of the electrodes 6, 7 on the material piece LP is reproduced schematically. An insulation wall 9 is located between the electrodes 6 and 7. The metallic structures $4^*_a$ and $4^*_k$ are connected together electrically. A more positive potential is produced at the metallic structure $4^*_a$, which is situated opposite the cathodically polarised electrode 6 so that this region of the structure is polarised anodically. A more negative potential is produced at the structure $4^*_k$ by the oppositely situated anodically polarised electrode 7 so that this region is polarised cathodically. In the illustrated arrangement, the structure $4^*_k$ is metallised when the electrolytic fluid 3 is a metallising bath. At the same time, an anodic process takes place at the anodically polarised structure $4^*_a$. If the electrolytic fluid 3 is a tin bath and the structures are made of copper, copper is not dissolved. Instead of this, oxygen is generated at the structure $4^*_a$.

During the electrolytic process, both soluble and insoluble electrodes can be used as electrodes. Soluble electrodes are normally used in the metallising method so as to reform again by dissolution the metal used in metallisation in the metallising solution. Thus, electrodes made of metal, which is to be deposited, are used. Insoluble electrodes are also inert in the treatment fluid during the current flow. For example, lead electrodes, platinised titanium electrodes, titanium or noble metal electrodes coated with iridium oxide can be used.

If the method and the device are used for electrolytic metallising, then a metallising bath containing metal ions is used. When using soluble, anodically polarised electrodes, the metal ions are supplied by dissolution of these electrodes. On the other hand, if insoluble electrodes are used, then the metal ions must be supplemented either by separate addition of suitable chemicals or for example the device described in WO 9518251 A1 is used in which metal parts are dissolved by additional ions of a redox pair, which ions are contained in the metallising bath. In this case, an $Fe^{2+}/Fe^{3+}$ or another redox pair is contained in the copper baths.

In a further variant of the method and device, the electrodes can be disposed in an electrode arrangement in such a way that they are orientated on only one side of the material pieces. In order to avoid a direct current flow in this case between the two electrodes, it is advantageous to dispose at least one insulation wall (for instance made of a polyimide film which is 50 μm thick) between the electrodes and to move said wall very near to the material pieces. The insulation walls are preferably disposed in such a way that they contact the material pieces when being transported through the electrolytic bath or that they reach at least directly up to the surfaces of the material pieces. As a result, an especially good screening of the anodic electrode from the cathodic electrode is achieved.

Since small structures to be metallised must be situated opposite both at least one cathodic and at least one anodic electrode for electrolytic treatment, the spacing between the electrodes, given an established size of the structures, must not exceed a specific value. Consequently, a top limit is also established for the thickness of the insulation wall. As a rule of thumb, it can be assumed that the thickness of the insulation wall should correspond at most to approximately half of the extension of the structures to be metallised, preferably comparing the dimensions respectively in the conveying direction of the material. In the case of structures with a width of approximately 100 μm, the thickness of the insulation wall should not exceed 50 μm. In the case of narrower structures, correspondingly thin insulation walls should be used.

Further insulation walls can be provided in addition between the individual electrode arrangements in order to avoid a direct current flow between the electrodes of further electrode arrangements which are disposed one behind the other.

In an alternative method and device variant, the electrodes of an electrode arrangement can also be disposed in such a way that they are orientated on different sides of the material pieces. In this case, the material pieces themselves function as insulation walls between the electrodes so that the use of other insulation walls between the electrodes of an electrode arrangement can be dispensed with when the electrodes do not protrude beyond the material pieces. This method and device variant can be applied when the electrically conductive regions on both sides of the material pieces are connected to each other electrically. This arrangement is suitable for example for the treatment of through hole plated circuit boards and conductive foils which are functional on one side. As a result of the fact that for example material pieces with a whole-surface electrically conductive layer are used on the side situated opposite the functional side, the cathodically polarised electrode can be disposed opposite this conductive layer and the anodically polarised electrode opposite the functional side, in order to deposit metal on the conductive structures of the functional side. At the same time, metal is removed from the oppositely situated conductive layer.

When implementing the method according to the invention, care must be taken that a direct current flow cannot flow between the cathodically polarised electrodes and the anodically polarised electrodes of an electrode arrangement. For this purpose, either the above-mentioned insulation walls or the material pieces themselves can be used if the oppositely polarised electrodes of an electrode arrangement are orientated on different sides of the material pieces. A third possibility for avoiding a direct current flow exists when the material pieces are not plunged in the treatment fluid but are brought in contact with the fluid by means of suitable nozzles. In this case, the insulation walls between the electrodes of an electrode arrangement, which electrodes are orientated on one side of the material pieces, can be totally dispensed with, when the fluid regions, which are in contact with the individual electrodes, are not in contact with each other.

An electrode arrangement can extend perpendicularly or diagonally to the direction in which the material pieces are transported in the treatment unit, preferably over the entire treatment width of the conveying plane. The spatial extension of the electrode arrangements, observed in conveying direction, has a significant effect on the duration of the electrolytic treatment. Long electrode arrangements can be used for whole-surface treatment. On the other hand, very short electrode arrangements must be used when treating very fine structures.

This can be explained in more detail with reference to FIG. 1. If the material pieces LP are moved from left to right (conveying direction 5"; case: electroplating), the leading right edge of a structure 4* is electroplated longer than the rear regions of the structure. As a result, an irregular layer thickness is obtained. The maximum thickness of the layer depends substantially upon the length of the electrode arrangement in the conveying direction 5', 5" and, furthermore, upon the conveying rate, the current density and the dimensions of the structures 4 in conveying direction 5', 5". Long electrode arrangements and, at the same time, long structures 4 in conveying direction 5', 5" result, measured absolutely, in large differences in layer thickness in the case of a large initial layer thickness. When the electrode arrangements have a smaller length in conveying direction 5', 5", the differences in layer thickness become smaller. At the same time, the treatment time is reduced. The dimensions of the electrode arrangements can therefore be adapted to requirement. In the case of the finest conductive track structures, for example 0.1 mm pads or conductive tracks of 50 μm width, the length of the electrode arrangements should be in the sub-millimeter region.

In order to multiply the effect of the method, at least two electrode arrangements can be provided in one treatment unit and the material pieces can be guided past said electrode arrangements successively. The electrodes of these electrode arrangements can have an extended configuration and be disposed substantially parallel to the conveying plane. The electrodes can be orientated either substantially perpendicular to the conveying direction or to form an angle α # 90° to the conveying direction. Said electrodes extend preferably over the entire width of the conveying plane covered by the material pieces.

With an arrangement in which the electrodes form an angle α # 90° to the conveying direction, it is achieved that electrically insulated metal structures, which are orientated both parallel to the conveying direction and perpendicular thereto, are subjected longer to the desired electrolytic reaction than when α≈90° (±25°). If the angle were α≈90°, then the conductive tracks, orientated in the conveying direction and at a given conveying rate and given electrode length, would be electrolytically treated for an adequate length of time, while conductive tracks orientated perpendicular thereto would only be treated in the electrode arrangement for a short period of time. This is due to the fact that electrolytic treatment is only possible if the structure is situated at the same time opposite the anodically polarised and the cathodically polarised electrode of an electrode arrangement. In the case of structures, which are orientated parallel to the electrode arrangement and hence to the electrodes, this contact time is short. The reverse applies when the electrode arrangements are orientated parallel to the conveying direction (α≈0° (±25°)).

The device according to the invention can also have a plurality of electrode arrangements with electrodes in an extended configuration, the electrodes of the different electrode arrangements forming different angles to the conveying direction. In particular, an arrangement of at least two extended electrode arrangements is advantageous, the angle between the electrode arrangements and the conveying direction of the material pieces in the treatment unit being a # 90° and the electrode arrangements being disposed approximately perpendicularly to each other. Preferably, $\alpha_1 \approx 45°$ (first electrode arrangement), especially 20° to 70°, and $\alpha_2 \approx 135°$ (second electrode arrangement), especially 110° to 160°.

In an especially preferred method, the electrodes are moved in an oscillating manner substantially parallel to the conveying plane. Furthermore, there can also be provided a plurality of electrode arrangements, which are disposed parallel to each other and adjacent and have electrodes in an extended configuration and insulation walls disposed respectively between said electrodes, and adjacent electrodes can be supplied respectively from a separate current/voltage source. In this case when for example a metallising solution is used, metal is firstly deposited on the insulated structures of the material pieces. Since the regions of the structures which are at the front during transportation are situated for longer in the metallising region than the rear structures, the thickness of the metal layer on the former is greater. If the material pieces then pass the second electrode arrangement, which comprises the second electrode in the first arrangement or a third electrode and a further oppositely polarised electrode in the second arrangement, then a lot of metal is removed again from the front regions of the material pieces and, on the rear structures, more metal is deposited than removed. Hence to sum up, an averaging of the thickness of the metal layer on the structures is effected during treatment in the two electrode arrangements.

In order to achieve an especially uniform metal layer thickness with this arrangement, the current density on the structures situated opposite the first electrode arrangement can be adjusted to a value which is approximately twice as great as the current density on the structures situated opposite the second electrode arrangement.

In a further preferred method, after being guided past at least one electrode arrangement, the material pieces can also be rotated by 180° about an axis which is perpendicular to the conveying plane and be delivered to the same or to a further electrode arrangement. As a result, a more uniform layer thickness distribution is effected during electrolytic treatment of structures which are orientated in any manner.

In a further preferred method, the electrode arrangements can in addition be surrounded by insulation walls. If a plurality of adjacent electrode arrangements is used, these insulation walls are disposed between the electrode arrangements. Openings, which are orientated towards the conveying plane, are formed through these insulation walls, which surround the electrode arrangements, and through the insulation walls, which are disposed between the electrodes.

These openings can have widths of various sizes in accordance with the existing requirements. For example, these openings have, regarded in the conveying direction, such a width respectively that the openings associated with the cathodically polarised electrodes are smaller than the openings associated with the anodically polarised electrodes when the method for depositing metal on the material pieces is used, or that the openings associated with the cathodically polarised electrodes are greater than the openings associated with the anodically polarised electrodes when the method for etching metal surfaces on the material pieces is applied.

It is achieved with this embodiment that the current density at the regions, situated opposite the cathodically polarised electrodes, on the material pieces to be treated is different from the current density at the regions which are situated opposite the anodically polarised electrodes. Due to these differences, potentials of different magnitude can be set at these regions to favour specific electrolytic processes and to repress others. Hence, it is possible for example to speed up the deposition of metal relative to the competing dissolution of the metal in order also to deposit metals at a greater thickness on the material pieces in this manner. Because in the above-mentioned case the current density, and hence the potential, at the region on the material pieces, which is situated opposite the cathodically polarised electrode, is increased, there occurs there as a competing reaction, the decomposition of water (generation of oxygen). As a result, less metal is dissolved than is deposited at the material surfaces which correspond to the anodically polarised electrodes. The reverse is of course true for an application in which metal is etched.

In order to prevent metal deposition on the cathodically polarised electrodes, these can be screened with ion-sensitive membranes so that electrolytic spaces are formed which surround the cathodically polarised electrodes. If ion-sensitive membranes are not used, deposited metal on the cathodically polarised electrodes must be removed again on a daily or weekly basis. For this purpose, for example a cathodically polarised surface electrode can be disposed for stripping these electrodes, the metallised electrodes being anodically polarised in this case. These stripping electrodes can be introduced into the electrode arrangement during production breaks instead of the material pieces to be treated. A cyclical exchange is also very simple with external stripping of the cathodically polarised electrodes.

Furthermore, it can be advantageous for treating the material pieces to modulate the electrical voltage applied to the electrodes of the electrode arrangements in such a way that a unipolar or bipolar current pulse sequence flows to the electrodes.

The subsequent Figures serve to further explain the invention and show in detail:

BRIEF DESCRIPTIONS OF DRAWING FIGS. 3–12

Figure 4:
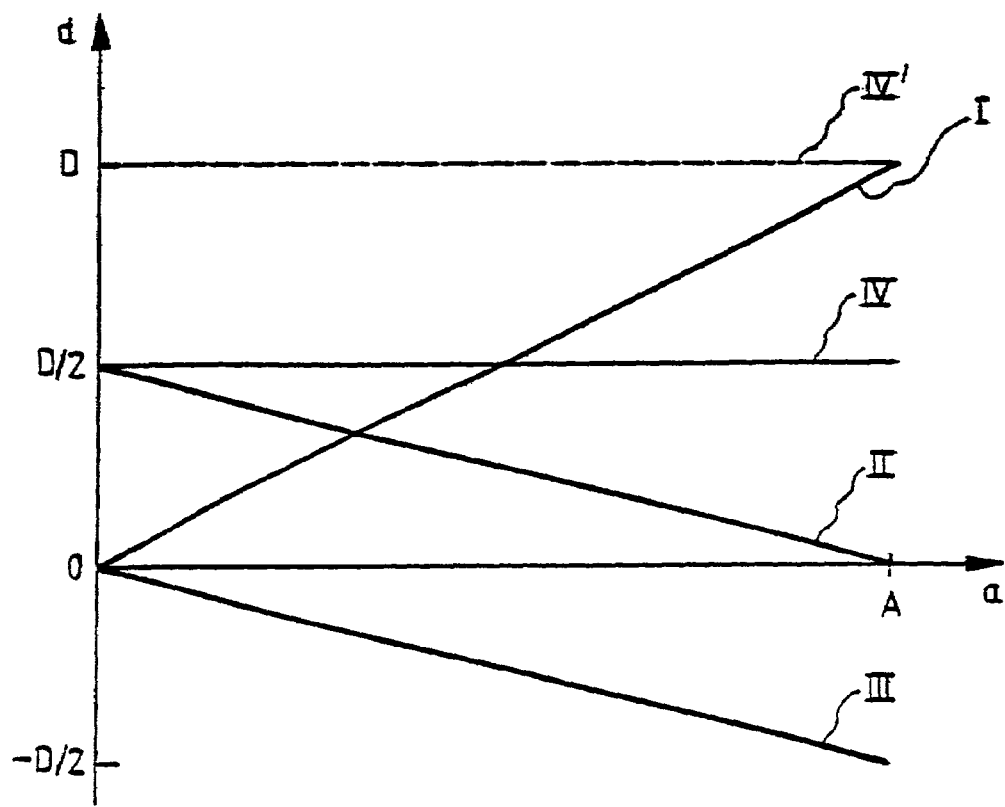
Figure 5:
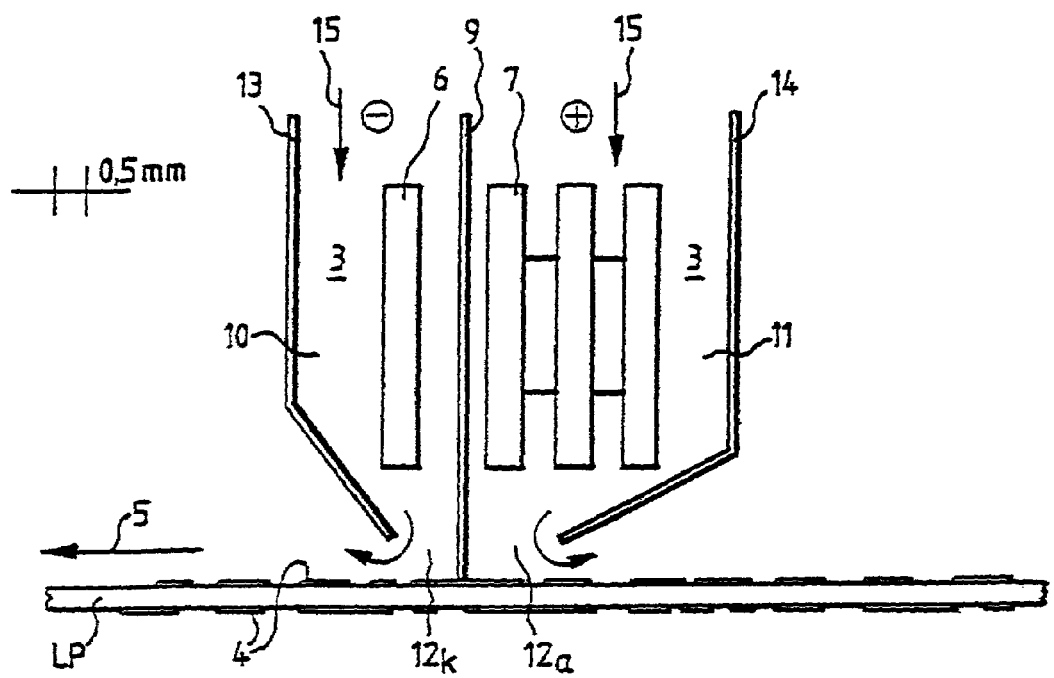
Figure 6:
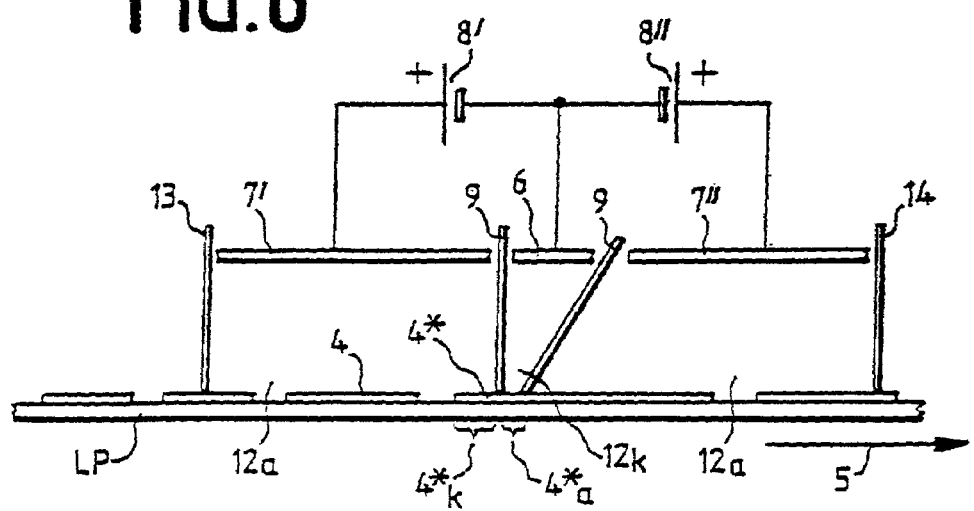
Figure 7:
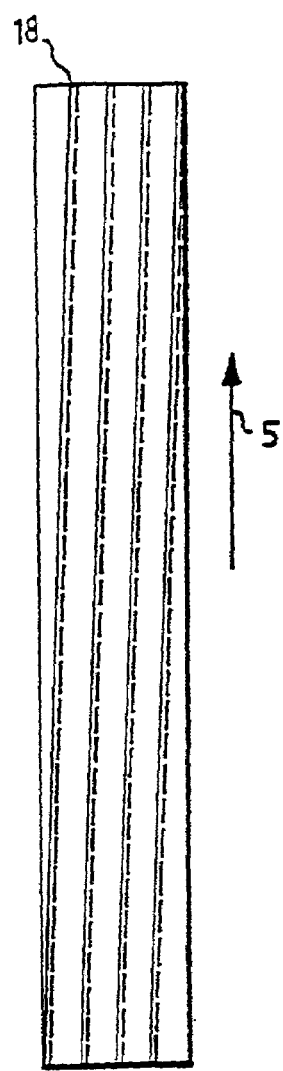
Figure 12:
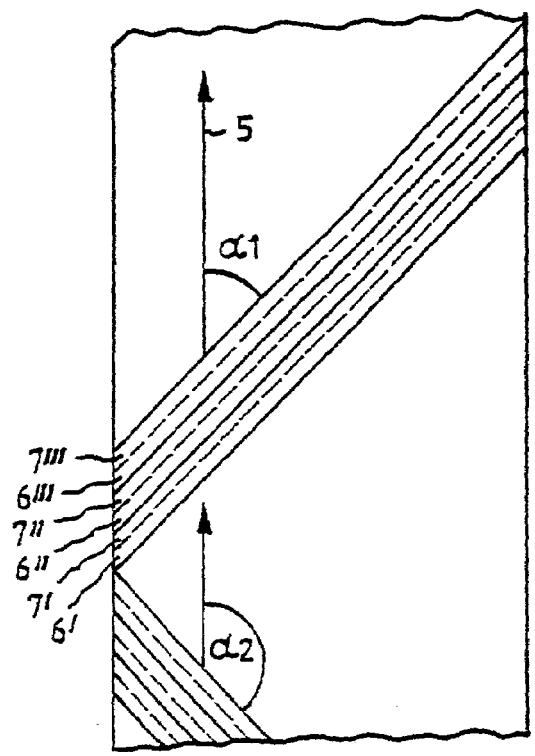
Figure 8A:
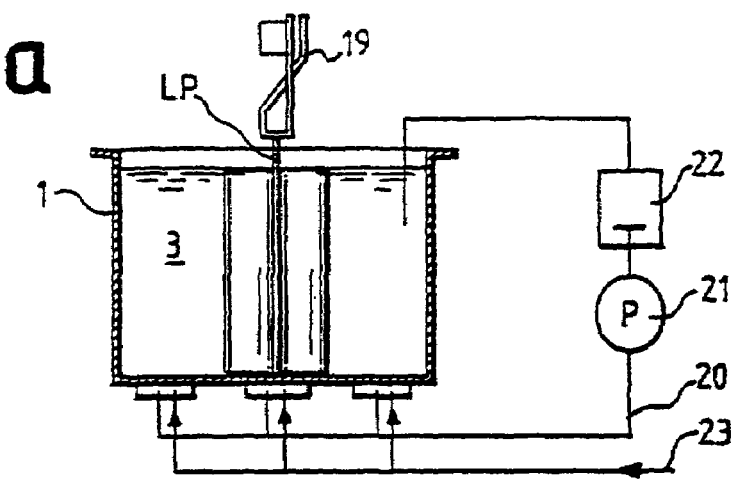
Figure 8B:
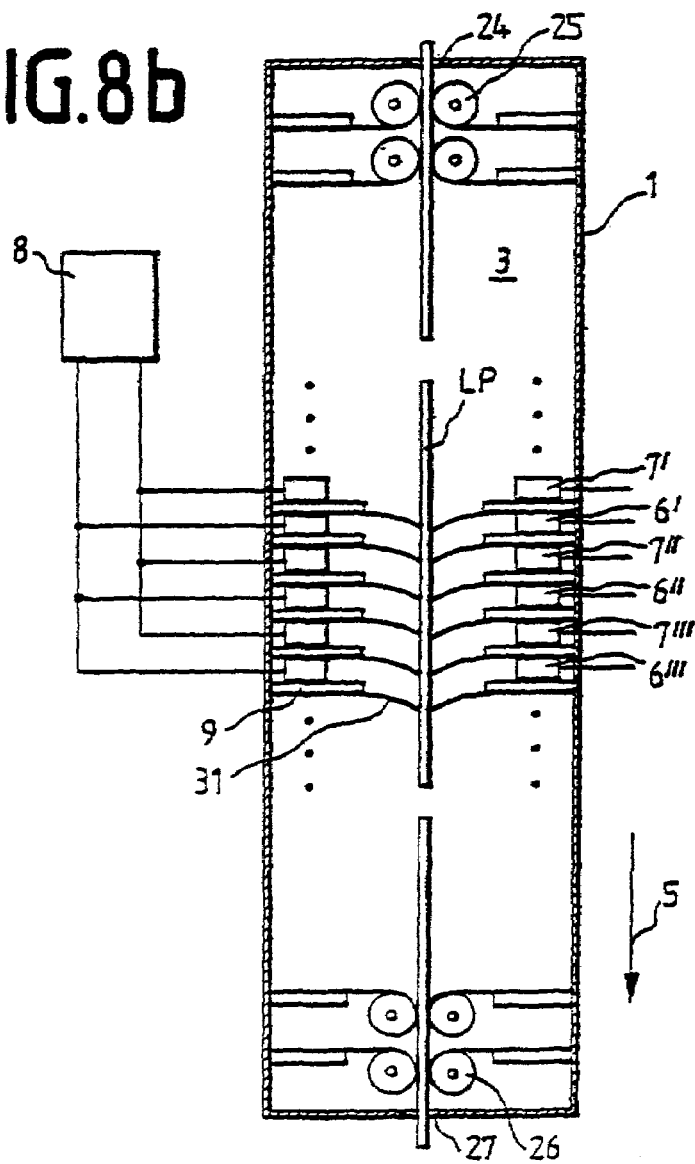
Figure 9:
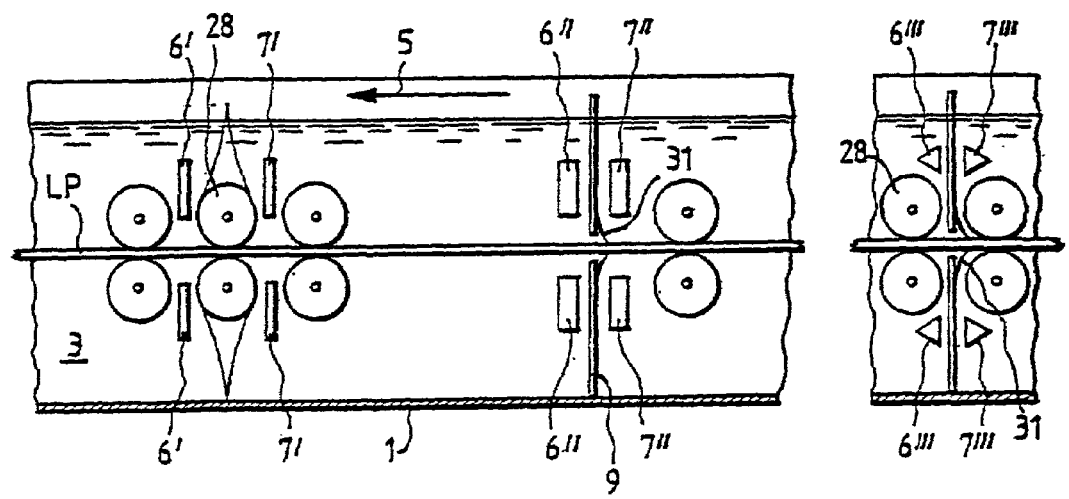
Figure 10:
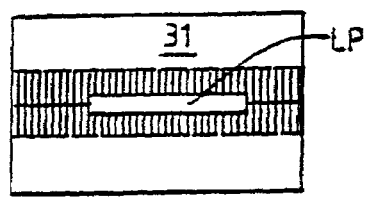
Figure 11:
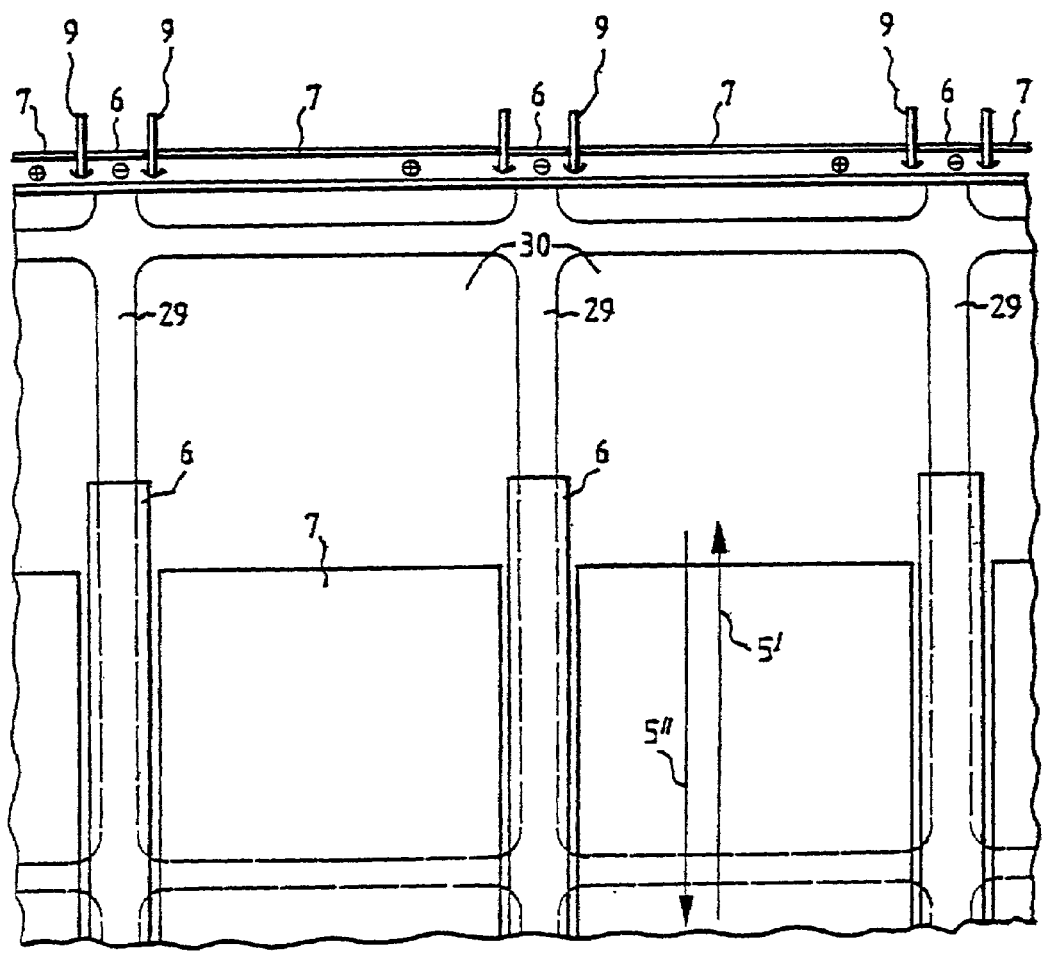

FIG. 3: a schematic illustration of the construction of an electrode arrangement;

FIG. 4: the layer thickness configuration of a structure after treatment in the device according to FIG. 3;

FIG. 5: a schematic illustration of two electrodes of an electrode arrangement;

FIG. 6: a schematic illustration of a plurality of electrodes which are associated with various electrode arrangements;

FIG. 7: a special arrangement of a plurality of electrode arrangements along a conveying route for the material pieces in a continuous system;

FIG. 8a: a section through a continuous system with a vertical conveying plane;

FIG. 8b: a plan view of a continuous system with a vertical conveying plane;

FIG. 9: a lateral section through continuous system in which the material pieces are transported in a horizontal conveying plane;

FIG. 10: a schematic illustration of a seal film in front elevation;

FIG. 11: a plan view of a material piece with copper structures and a projection of the electrodes from a plurality of electrode arrangements;

FIG. 12: a further special arrangement of a plurality of electrode arrangements along the conveying route for the material pieces in a continuous system.

FURTHER DETAILED DESCRIPTION OF THE INVENTION

An electrode arrangement according to FIGS. 1 and 2 is eminently suitable for treating large-surface metal surfaces. The length of the electrodes in conveying direction determines, together with the conveying rate, the duration of the electrolytic treatment with an electrode arrangement. In the case of large surfaces or large structures to be treated, a large electrode length in conveying direction is chosen, at least if this concerns the process-determining electrode.

If care is taken by means of appropriate process parameters that the treatment effect achieved firstly at the first electrode is not reversed again or at least not entirely by treatment at the second electrode of an electrode arrangement, then a plurality of electrode arrangements according to the invention can be disposed successively in conveying direction, i.e. a material piece is guided past a plurality of electrode arrangements successively. The respective treatment results, which are achieved with the individual electrode arrangements, accumulate. The length of the electrode arrangements in conveying direction must be adapted to the size of the structures to be treated. When treating small structures, this length must also be selected to be small. The number of electrode arrangements must be chosen to be correspondingly greater when a treatment outcome is required. It is always a prerequisite that the treatment outcome is not reversed again by the respectively subsequent electrode of an electrode arrangement. For example, an already deposited metal layer should not be removed again when passing a subsequent cathodically polarised electrode.

In the case of very small structures to be treated, the treatment of the edge regions of structures to be treated, which are guided past the electrodes firstly or lastly, comes to the fore. However, these edge regions should also be electrolytically treated in as uniform a manner as possible. For this purpose, the possibility of being able to set electrochemically "oppositely directed" reactions (for example metallising, stripping) in the electrode arrangement in a targeted manner is used advantageously. With reference to FIG. 3, the very uniform electrolytic treatment of even the smallest structures (width 0.1 mm) is described.

In FIG. 3, an arrangement with two electrode arrangements is reproduced which have respectively anodically and cathodically polarised electrodes 6', 7', 6", 7". A material piece LP with the structures 4, for example conductive track structures made of copper, is guided in conveying direction 5 through a not-shown electrolytic fluid. A tin bath is used in this example as electrolytic fluid.

The cathodically polarised electrodes 6', 6" are screened by ion-sensitive diaphragms 16 from the surrounding electrolytic space. As a result, the deposition of tin on the electrodes 6', 6" from the electrolytic fluid is prevented. Insulation walls 9' or 9" are located respectively between the electrodes 6' and 7' or 6" and 7". An insulation wall 17 is disposed between the two electrode arrangements. The diaphragms 16 can also be dispensed with. In this case, the cathodically polarised electrodes need to be stripped from time to time.

The structures 4 are metallised in the first electrode arrangement in which the electrodes 6' and 7' are located. As a result of the fact that the structures 4 are guided past the electrode arrangement from left to right, the right edge of the structures 4 is subjected for a longer time to the electrolytic reaction than the left edge so that the deposited quantity of metal and hence the thickness of the metal layer is greater than on the left edge. In order to compensate at least in part for this lack of balance, the material piece LP is guided past the second electrode arrangement after passing through the first electrode arrangement. In this arrangement, the sequence of the cathodically polarised electrode 6" and of the anodically polarised electrode 7" is changed relative to the polarity of the electrodes 6' and 7' in the first electrode arrangement so that the left edge of the structures 4 respectively is subjected for a longer time to the electrochemical (electroplating) effect of the electrode 7" than the respective right edge. The right edge of the structures 4 is anodically polarised when passing the cathodically polarised electrode 6" and hence is subjected for a longer time to the anodic reaction than the left edge of the structures 4 so that, in this case, metal is preferably removed again on the right edge. As a result, a substantially uniformly thin layer of tin is deposited.

This result can be understood with the help of the diagram in FIG. 4 in which the obtained metal layer thickness d is reproduced as a function of the length extension a of the structure 4 to be coated. This diagram was drawn up with the condition that the current in the second electrode arrangement is half as great as in the first electrode arrangement and that the current yield of the electrochemical reactions (metal dissolution, metal deposition) is close to 100%.

The layer thickness distribution, which can be measured after the material piece has passed through the first electrode arrangement, is designated by the curve I. On the left edge of the structures 4 (a=0), practically no metal has been deposited, while on the right edge (a=A) the layer thickness D is achieved. Two processes take place when passing the second electrode arrangement: at the left edge, in practice only metal is deposited (partial process, displayed by curve II). Thus, the layer thickness D/2 is achieved in this region. In addition, in practice only metal is removed at the right edge (partial process, displayed by curve III). Thus, the layer thickness at this location is reduced from originally d=D to d=D/2. The intermediate regions on the structure likewise have substantially a layer thickness of d=D/2. The resulting layer thickness distribution is indicated in curve IV.

By optimising the treatment bath, the metallisation can be improved even further: by using a bath for metal deposition, which does not permit metal dissolution, a greater metal layer thickness can be achieved in total. In this case, the currents of the first and of the second electrode arrangement must be of equal size. The curve III shown in FIG. 4 coincides in this case with the abscissa since no metal is dissolved. Therefore, a thickness D of the layer is obtained which is constant over the total surface of the metal structures (curve IV').

A further simplification of the arrangement according to FIG. 3 is achieved in that the central regions with the electrodes 7', 7" are combined so as to form one region with one electrode. In this case, two current/voltage sources are also required to supply current to the electrodes with which the different currents to both partial electrode arrangements, comprising the electrode 6' and the electrode 7', 7", on the one hand, and the electrode 7', 7" and the electrode 6", on the other hand, can be produced. The dividing wall 17 is dropped in this case. The mechanical assembly of the electrode arrangements is particularly simple in this case.

The schematic assembly of the electrode arrangement in a preferred embodiment of the invention is reproduced in FIG. 5. The material piece LP with the structures 4 is illustrated underneath the electrode arrangement (the structures 4 situated on the underside of the material piece LP are electrolytically treated by a second electrode arrangement on the underside of the material piece). The material piece LP is guided in the conveying direction 5. The electrode arrangement comprises electrodes 6 (cathodic) and 7 (anodic). Between the electrodes 6 and 7 there is an insulation wall 9 which is situated in this case on the material piece LP and effects an effective, electrical screening of the field lines which emanate from the electrodes 6 and 7. The electrodes 6 and 7 are surrounded by the cathodic space 10 and the anodic space 11 in which the electrolytic fluid 3 is located. Both spaces 10 and 11 open towards the conveying plane in which the material piece LP is guided. Focussing of the effect of the electrodes on a small region of the material piece LP is achieved by two small openings $12_k$ and $12_a$ which are formed through the lateral insulation walls 13, 14 and the insulation wall 9 between the electrodes 6 and 7. This is advantageous since, as a result, the electrolytic treatment of the small structures 4 is evened out. In contrast thereto, the electrolytic treatment of small structures, when large openings $12_a$ and $12_k$ are chosen, is irregular.

As can also be detected in FIG. 5, the electrolytic fluid 3 is fed into the electrode arrangements from above (shown by the arrows 15). The electrochemical reaction can be speeded up because of the high flow rate.

In FIG. 6 there is shown a further arrangement according to the invention with a plurality of adjacent electrodes 6, 7', 7". The electrodes 6, 7', 7" are connected to the current/voltage sources 8', 8", for example galvano-rectifiers. Insulation walls 9 are located between the electrodes. A material piece LP to be treated is moved in conveying direction 5 in the conveying plane. The respective electrolytic spaces, which surround the electrodes 6, 7, have openings $12_a$, $12_k$, which are orientated towards the conveying plane and are formed by the insulation walls 9. These openings $12_a$, $12_k$ are of different sizes. As a result, current densities of different size are set and hence also different potentials at the regions 4, 4* on the material piece LP which are situated opposite the openings $12_a$, $12_k$.

In the situation where a material piece LP provided with metallic regions 4 is treated in a metal deposition solution, the following situation arises.

As a result of the fact that the opening $12_k$ on the cathodically polarised electrode 6 is smaller than the opening $12_a$, on the anodically polarised electrode 7, a higher current density and hence a higher potential is set at the regions $4*_a$ situated opposite the cathodically polarised electrode 6 than is set at the regions $4*_k$ of the treated region 4*, which regions are situated opposite the anodically polarised electrodes 7', 7". Consequently, the competing oxygen generation will take place also, in addition to metal dissolution, during the anodic partial process in the region of the cathodically polarised electrode 6 so that less metal is removed in this region $4*_a$ than the amount of metal deposited in the region $4*_k$. In summary, a metal layer is thus formed.

In FIG. 7, a special arrangement of a plurality of electrode arrangements 18 along the conveying route for the material pieces in a continuous system is reproduced in plan view. The electrodes in the arrangement of FIG. 1 are schematically illustrated by the continuous and broken straight lines. The electrode arrangements 18 are set slightly diagonally in the conveying direction 5 and extend at a corresponding length in the electrolytic unit. Each electrode arrangement 18 serves only for treating a part of the surface of the material pieces to be treated. Hence, the treatment time is significantly increased. If the electrolytic unit has for example a length of 1.40 m and a width of 0.2 m, then, in the illustrated arrangement with four electrode arrangements 18, there results an increase in treatment time of 1400 mm×4/200 mm=28. In the case of an active length of an electrode arrangement 18 of 1 mm, there results hence a treatment time of approximately 17 sec, at a conveying rate of for example 0.1 m/min. With an average deposition current density at the level of 10 A/dm², the layer thickness of deposited copper is approximately 0.6 $\mu$m. If a plurality of electrodes is used to treat partial regions of the material pieces, then the layer thickness multiplies with the number of electrodes.

A continuous system 1 is illustrated in section in FIG. 8a. The material pieces LP are transported in this case by a gripping mechanism 19, for example a clamp or by cylinders which are not shown here, and held vertically. The material pieces LP are introduced into a container 1 from the side, said container containing the treatment bath, for example a metallisation solution 3. This solution is continuously withdrawn from the container by means of a pump 21 via suitable pipelines 20 and guided over a filter 22 before said solution is fed back into the container 1. In addition, air can be introduced via a pipeline 23 in the container 1 in order to add turbulence to the solution 3.

In FIG. 8b, the unit shown in FIG. 8a is reproduced in a plan view, the fittings only being illustrated in part. The material pieces LP are guided in conveying direction 5. The treatment fluid 3 is situated internally of the container 1, in this case a solution which is suitable for electrolytic etching. The material pieces LP are introduced via the opening 24 and through squeeze rollers 25 into the container and between squeeze rollers 26 and through the opening 27 once again out of the container.

In the container 1, there is a plurality of electrode arrangements, which are disposed successively and on both sides of the conveying plane for the material pieces LP, said electrode arrangements being formed respectively from cathodically polarised electrodes 6', 6", 6'", . . . and anodically polarised electrodes 7', 7", 7'", . . . Insulation walls 9 are situated between the electrodes. These insulation walls 9 have elastic seal films 31 which make possible complete screening of the electrical fields of the individual electrode spaces from each other in that they contact the material surfaces when passing the material pieces LP. The electrodes 6', 6", 6'", . . . , 7', 7", 7'", . . . are connected to a galvano-rectifier 8, the connections of the electrodes shown on the right in FIG. 8b to the rectifier not being illustrated. Each electrode arrangement can also be supplied from separate rectifiers.

When the material pieces LP are guided for example first past an anodically polarised electrode and then past a cathodically polarised electrode, metal is electrolytically removed.

In FIG. 9, a horizontal unit (continuous system with a horizontal conveying plane) is illustrated in lateral section. The container 1 contains the treatment fluid 3. The material pieces LP to be treated are guided in the treatment fluid 3 past the electrode arrangements in a horizontal conveying direction 5. The electrode arrangements in turn comprise respectively cathodically polarised electrodes 6', 6", 6'", . . . and anodically polarised electrodes 7', 7", 7'", . . . The electrode arrangements are disposed on both sides of the conveying plane in which the material pieces LP are guided.

In the present case, insulation rollers 28 with sealing lips are used to insulate the electrodes 6', 6", 6'", . . . , 7', 7", 7'", . . . from each other. Instead of insulation rollers 28, insulation walls 9 with seal films 31 can also be used.

In the right part of FIG. 9, an alternative embodiment and arrangement of the electrodes 6'", 7'" relative to the insulation walls 9 and seal films 31 is illustrated.

In FIG. 10, a detail of an insulation between the electrodes of an electrode arrangement is illustrated in front elevation. In order to achieve a secure seal during treatment of thicker circuit boards LP, the seal film 31 can be spring-loaded on the insulation wall. Gaps are thus avoided which can arise laterally to the passing circuit board LP.

FIG. 11 shows a plan view of a structured material piece, which is conveyed in a continuous system, for example a circuit board laminate LP which has metal sacrificial regions 29 and regions 30 provided with metal structures (structures not shown) which are connected to each other electrically. This material piece LP can be treated for example in a horizontal unit by being brought in contact with the treatment fluid and being guided past the electrode arrangements according to the invention. The electrodes 6, 7 of the electrode arrangements are illustrated here in projection on the material piece LP. The anodically polarised electrodes 7 are orientated on the structured regions 30 and designated by "⊖" and the cathodically polarised electrodes 6 orientated on the sacrificial regions 29, which are made of metal and are designated by "θ". Insulation walls 9 are disposed between the electrodes 6 and 7. The insulation walls 9 and the electrodes 6, 7 are only indicated in the illustration of FIG. 11, this detail concerning a section representation through the plane of projection of the FIG. 11.

The material piece is guided in one of the conveying directions 5' and 5". The sacrificial regions 29, which are made of metal, are continuously guided past the cathodically polarised electrodes 6 and thus are dissolved. The structured regions 30, on the other hand, are metallised since they are guided past the anodically polarised electrodes 7. By means of this arrangement, it is possible for a metal to be deposited which is identical to the metal from which the structured regions 30 are made.

A further preferred device according to the invention is illustrated schematically in FIG. 12. The material pieces are guided past the electrode arrangements in conveying direction 5, said electrode arrangements comprising respectively extended electrodes 6', 6", 6'", . . . and 7', 7", 7'", . . . The electrode arrangements with the electrodes form an angle $\alpha_1$ or an angle $\alpha_2$ relative to the conveying direction 5. As a result, the effect of the treatment time of structures which are orientated differently relative to the conveying direction 5 is compensated for. Since, in the case of circuit boards, the conductive tracks usually extend parallel or perpendicular to a lateral edge of the boards and hence parallel or perpendicular to the conveying direction 5, a treatment time of equal length is achieved for conductive tracks of both orientations by means of the illustrated orientation of the electrode arrangements, as long as these conductive tracks of both orientations have the same length.

REFERENCE SYMBOLS

1 bath container
2 level of the treatment fluid 3
3 treatment fluid
4 metallic structure/surface on the material pieces LP
4\* treated metallic structure 4
**4$*_a$ anodically treated metallic structure 4**
**4$*_k$ cathodically treated metallic structure 4**
5, 5', 4", conveying direction
6, 6', 6", 6'" cathodically polarised electrodes
7, 7', 7"7'" anodically polarised electrodes
8, 8', 8" current/voltage sources
9 insulation wall
10 cathodic space
11 anodic space
12 (not shown) opening of the electrode arrangement to the bath container
12$_k$ opening to the cathodically polarised electrode
12$_a$ opening to the anodically polarised electrode
13 insulating lateral wall of the electrode arrangement
14 insulating lateral wall of the electrode arrangement
15 flow direction of the treatment fluid 3
16 diaphragm
17 insulation wall between two electrode arrangements
18 electrode arrangement
19 clamp
20 pipeline
21 pump
22 filter
23 air supply
24 inlet opening
25 squeeze roller
26 squeeze roller
27 outlet opening
28 insulation roller
29 sacrificial region
30 structured region
31 seal film
LP sheet/foil material piece

What is claimed is:

1. Method for electrolytic treatment of electrically conductive structures (4) on surfaces of mutually isolated sheet and foil material pieces (LP), comprising the steps of:
   a) transporting the material pieces (LP) through a treatment unit and thereby bringing the material pieces in contact with treatment fluid (3);
   b) during the transporting, guiding the material pieces (LP) past at least one electrode arrangement, which comprises respectively at least one cathodically polarised electrode (6) and at least one anodically polarised electrode (7), the at least one cathodically polarised electrode (6) and the at least one anodically polarised electrode (7) being brought in contact with the treatment fluid (3) and being connected to a current/voltage source (8), flowing a current through the electrodes (6, 7) and the electrically conductive structures (4) so that electrolytic treatment takes place at the electrically conductive structures (4) of the material pieces;
   c) providing the electrodes (6, 7) of the at least one electrode arrangement in such a manner that they are orientated on one side of the material pieces (LP), and that at least one insulation wall (9) is disposed between the electrodes (6, 7) wherein the guiding of the material pieces past the at least one electrode arrangement does not require electrical contact of the material pieces with any electrode in order to effect the electrolytic treatment;
   d) providing the material pieces comprising the electrically conductive structures; and
   e) arranging the at least one cathodically polarised electrode and the at least one anodically polarised electrode in the at least one electrode arrangement to match the size of electrically conductive structures on the surfaces of the material pieces, such that electric field lines emanating from the at least one cathodically polarised electrode and from the at least one anodically polarised electrode are effective to electrolytically treat a same one of the electrically conductive structures of one of the material pieces.

2. Method according to claim 1, characterised in that at least the one insulation wall (9) is disposed in such a manner that it contacts the material pieces (LP) during transportation through the treatment unit or that it at least reaches directly up to the material pieces (LP).

3. Method according to one of the preceding claims 1–2, characterised in that the material pieces (LP) are guided successively past at least two electrode arrangements.

4. Method according to one of the preceding claims 1–2, characterised in that the material pieces (LP) are transported in a conveying direction (5) and in a conveying plane and in that the electrodes (6, 7) have an extended configuration and are disposed substantially parallel to the conveying plane.

5. Method according to claim 4, characterised in that the electrodes (6, 7) extend approximately over the entire width of the material pieces (LP) and substantially perpendicular to the conveying direction (5).

6. Method according to claim 4, characterised in that the electrodes (6, 7) form an angle $\alpha \neq 90°$ to the conveying direction (5).

7. Method according to claim 4, characterised in that the material pieces (LP) are guided past at least two electrode arrangements with electrodes (6, 7) in an extended configuration, the electrodes (6, 7) of different electrode arrangements forming difference angles to the conveying direction (5).

8. Method according to claim 4, further comprising the step of moving the electrodes (6, 7) in an oscillating manner substantially parallel to the conveying plane.

9. Method according to claim 4, characterised in that a plurality of insulation walls (13, 14) surrounding the at least one electrode arrangement are provided, in that openings ($12_k$, $12_a$) are provided to the at least one electrode arrangement, which openings are orientated towards the surfaces of the material pieces (LP) and are formed by the insulation walls (13, 14) surrounding the at least one electrode arrangement and the at least one insulation wall (9) disposed between the electrodes (6, 7), and one of the openings ($12_k$, $12_a$) is associated with the cathodically polarised electrode (6) and one of the openings ($12_k$, $12_a$) is associated with the anodically polarised electrode (7), and when observed in the conveying direction (5), the one of the openings ($12_k$, $12_a$) associated with the cathodically polarised electrode (6) is smaller than the one of the openings ($12_k$, $12_a$) associated with the anodically polarised electrode (7), when the method is applied for depositing metal on the material pieces (LP), or the one of the openings ($12_k$, $12_a$) associated with the cathodically polarised electrode (6) is larger than the one of the openings ($12_k$, $12_a$) associated with the anodically polarised electrode (7), when the method is applied for etching at least one metal surface on the material pieces (LP).

10. Method according to claim 4, characterised in that, after passing the at least one electrode arrangement, the material pieces (LP) are rotated by 180° about an axis which is perpendicular to the conveying plane.

11. Method according to one of the preceding claims 1–2, characterised in that a plurality of electrode arrangements, which are disposed parallel to each other and adjacent, are provided with the electrodes (6, 7) in an extended configuration and that electrodes (6, 7), which are adjacent to each other, are connected respectively to the current/voltage source (8).

12. Method according to claim 11, characterised in that the current density at the surfaces (4), which are situated opposite the first electrode arrangement, is set approximately twice as great as the current density at the surfaces (4), which are situated opposite the second electrode arrangement.

13. Method according to one of the preceding claims 1–2, characterised in that the at least one cathodically polarised electrode includes a plurality of cathodically polarised electrodes, and in that electrolytic spaces (10), which surround the cathodically polarised electrodes (6), are screened by ion-sensitive membranes (16).

14. Method according to one of the preceding claims 1–2, characterised in that the electrical current is modulated in such a way that a unipolar or bipolar current pulse sequence flows through the electrodes (6, 7) and the surfaces.

15. The method according to one of the preceding claims 1–2, wherein the electrically conductive structures (4) of the mutually isolated sheet and foil material pieces (LP) comprise mutually electrically insulated, electrically conductive structures.

16. The method according to one of the preceding claims 1–2, for depositing metal on the material pieces (LP), including the steps of the material pieces (LP) being guided firstly past the at least one cathodically polarised electrode (6) and then past the at least one anodically polarised electrode (7).

17. The method of claim 16 wherein the electrically conductive structures of the material pieces are made of copper, and the method is used for depositing tin on the electrically conductive structures (4) of the material pieces (LP).

18. The method according to one of claims the preceding 1–2 wherein the electrically conductive structures (4) are metal structures, the method is used for etching the metal structures, and the material pieces (LP) are guided firstly past the at least one anodically polarised electrode (7) and then past the at least one cathodically polarised electrode (6).

19. Device for electrolytic treatment of electrically conductive structures (4) on surfaces of mutually isolated sheet and foil material pieces (LP), the device comprising:
   a) at least one means for bringing the material pieces (LP) in contact with a treatment fluid (3) when the treatment fluid is applied to the device;
   b) transport means for transporting the material pieces (LP) in a conveying direction (5) and in a conveying plane through a treatment unit;
   c) at least one electrode arrangement, which comprises respectively at least one cathodically polarised electrode (6) and at least one anodically polarised electrode (7), the at least one cathodically polarised electrode (6) and the at least one anodically polarised electrode (7) being adapted to make contact with the treatment fluid (3) when the treatment fluid is applied to the device;
   d) the at least one cathodically polarised electrode (6) and the at least one anodically polarised electrode (7) of the at least one electrode arrangement being arranged on one side of the conveying plane;
   e) at least one insulating wall (9) provided between the at least one cathodically polarised electrode and the at least one anodically polarised electrode (6, 7) in the at least one electrode arrangement; and
   f) at least one current/voltage source (8) being electrically connected to the at least one electrode arrangement in order to produce a current flow through the electrodes (6, 7) of the at least one electrode arrangement;
   g) wherein the means for bringing the material pieces (LP) in contact with the treatment fluid (3) includes means for guiding the material pieces past the electrodes to effect electrolytic treatment without requiring electrical contact of the material pieces with any electrode; and
   h) wherein the at least one cathodically polarised electrode and the at least one anodically polarised electrode are arranged in the at least one electrode arrangement to match the size of the electrically conductive structures on the surfaces of the material pieces, such that electric field lines emanating from the at least one cathodically polarised electrode and from the at least one anodically polarised electrode are effective to electrolytically treat a same one of the electrically conductive structures of one of the material pieces.

20. Device according to claim 19, characterised in that at least the one insulation wall (9) is disposed in such a manner that it contacts the material pieces (LP) during transportation through the treatment unit or that it at least reaches directly up to the material pieces (LP).

21. Device according to one of claims 19–20, characterised in that the electrodes (6, 7) have an extended configuration and are disposed substantially parallel to the conveying plane.

22. Device according to claim 21, characterised in that the electrodes (6, 7) extend approximately over the entire width of the conveying plane occupied by the material pieces (LP) and substantially perpendicular to the conveying direction (5).

23. Device according to claim 21, characterised in that the electrodes (6, 7) form an angle $\alpha \neq 90°$ to the conveying direction (5).

24. Device according to claim 21, characterised in that the electrodes (6, 7) having an extended configuration are configured in such a way that they can be moved in an oscillating manner substantially parallel to the conveying plane.

25. Device according to one of claims 19–20, characterised in that the at least one electrode arrangement includes at least two electrode arrangements with electrodes (6, 7) in an extended configuration, at least one electrode (6, 7) of different electrode arrangements forming different angles to the conveying direction (5).

26. Device according to one of claims 19–20, further comprising:
   a plurality of insulation walls (13, 14) surrounding the at least one electrode arrangement, said plurality of insulation walls (13, 14) surrounding the at least one electrode arrangement and said at least one wall disposed between the electrodes (6, 7) forming openings ($12_k$, $12_a$) to the at least one electrode arrangement, said openings being orientated towards the conveying plane, one of said openings ($12_k$, $12_a$) being associated with the cathodically polarised electrode (6) and one of said openings ($12_k$, $12_a$) being associated with the anodically polarised electrode (7), and when observed in the conveying direction, said one of said openings ($12_k$, $12_a$) associated with the cathodically polarised electrode (6) is smaller than said one of said openings ($12_k$, $12_a$) associated with the anodically polarised electrode (7), when the device is used for depositing metal on the material pieces (LP), or said one of said openings ($12_k$, $12_a$) associated with the cathodically polarised electrode (6) is larger than said one of said openings ($12_k$, $12_a$) associated with the anodically polarised electrode (7), when the device is used for etching surfaces on the material pieces that are metal.

27. Device according to one of claims 19–20, characterised in that electrolytic spaces (10), which surround the at least one cathodically polarised electrode (6) are screened by ion-sensitive membranes (16).

28. Device according to one of claims 19–20, characterised in that a plurality of electrode arrangements, which are disposed parallel to each other and adjacent, are provided with the electrodes (6, 7) in an extended configuration and that the electrodes (6, 7), which are adjacent to each other, are connected respectively to a separate current/voltage source (8).

* * * * *